United States Patent [19]
Omoto

[11] Patent Number: 5,645,707
[45] Date of Patent: Jul. 8, 1997

[54] BONDING METHOD FOR CHIP-TYPE ELECTRONIC PARTS

[75] Inventor: Masatoshi Omoto, Osaka, Japan

[73] Assignee: Sharp Kabushiki Kaisha, Osaka, Japan

[21] Appl. No.: 516,560

[22] Filed: Aug. 18, 1995

[30] Foreign Application Priority Data

Aug. 25, 1994 [JP] Japan .................................. 6-200555

[51] Int. Cl.$^6$ ........................................................ C25D 2/00
[52] U.S. Cl. ............................ 205/114; 205/223; 437/204; 437/209
[58] Field of Search ................................ 205/114, 123; 437/204, 209

[56] References Cited

U.S. PATENT DOCUMENTS

| | | | |
|---|---|---|---|
| 5,290,423 | 3/1994 | Helber | 205/114 |
| 5,407,864 | 4/1995 | Kim | 437/203 |
| 5,457,149 | 10/1995 | Hall | 25/523 |

OTHER PUBLICATIONS

George A. DiBari, "Nickel Plating", The Metal Finishing Handbook (Jan. 1987) pp. 240–262. Jan. 1987.

*Primary Examiner*—John Niebling
*Assistant Examiner*—Brendan Mee
*Attorney, Agent, or Firm*—Nixon & Vanderhye P.C.

[57] ABSTRACT

In a bonding method for a chip-type electronic part, the electronic part is prefixed onto an element-mounting section of a wiring substrate by using a non-conductive adhesive agent while an external metal electrode of the electronic part is brought close to, or in contact with the metal wiring pattern formed on the wiring substrate. Then, the wiring substrate, on which the electronic part has been prefixed, is subjected to an electroplating process while it is immersed into plating liquid containing a metal component, so that the metal component, which is deposited on the metal wiring pattern, grows to form a metal layer, and the external metal electrode and the metal wiring pattern are thus electrically connected to each other through the metal layer. With this arrangement, since no short circuit occurs between the external metal electrodes or between the portions of the metal wiring pattern, it is possible to miniaturize the electronic part and also to narrow its packaging pitch, thereby achieving a high-density packaging. Further, no stress, such as caused by heat and pressure during the bonding process, is applied onto the wiring substrate and the chip-type electronic part. This makes it possible to remarkably improve the reliability of the apparatus.

11 Claims, 5 Drawing Sheets

BONDING METHOD FOR CHIP-TYPE ELECTRONIC PARTS

FIELD OF THE INVENTION

The present invention relates to a bonding method for chip-type electronic parts, especially for chip-type LED elements, and more specifically concerns a bonding method for the chip-type LED elements that are preferably used in assembling LED display apparatuses, such as LED arrays used in light sources and LED dot matrixes.

BACKGROUND OF THE INVENTION

Conventionally, the following various bonding methods have been commonly used for packaging, on a wiring substrate, chip-type LED elements (hereinafter, referred to as LED elements) which are one example of chip-type electronic parts.

The first bonding method is a method using silver paste. As illustrated in FIG. 5, drops of silver paste 53 are applied onto portions of a metal wiring pattern 52 that are placed opposing to each other with each element-mounting section of a wiring substrate 51 located in between. Then, external metal electrodes 55, each formed on each end of an LED element 54, are kept in contact with the drops of silver paste 53, and the metal wiring pattern 52 and the external metal electrodes 55 are bonded by thermosetting the silver paste 53.

The second bonding method is a method using soldering paste. As illustrated in FIG. 6, drops of soldering paste 56 are applied onto the metal wiring pattern 52 of the wiring substrate 51. Then, the external metal electrodes 55 of the LED element 54 are respectively kept in contact with the drops of soldering paste 56, and the metal wiring pattern 52 and the external metal electrodes 55 are bonded by reflow-setting the soldering paste 56.

The third bonding method is a method using anisotropic conductive paste. As illustrated in FIG. 7, anisotropic conductive paste 57 is applied onto the metal wiring pattern 52 of the wiring substrate 51. Then, the external metal electrodes 55 of the LED element 54 are respectively kept in contact with the anisotropic conductive paste 57, and the metal wiring pattern 52 and the external metal electrodes 55 are bonded by setting the anisotropic conductive paste 57 through thermocompression bonding.

In the first and second bonding methods, however, extra portions of the silver paste 53 or the soldering paste 56 tend to leak out; this tend to cause a short circuit between the external metal electrodes 55 or between the portions of the metal wiring pattern 52. This also causes a difficulty in narrowing the gap between the opposing external metal electrodes 55, and thus causes a difficulty in further miniaturizing the LED element 54. For the same reason, it is difficult to narrow the mounting pitch between the LED elements 54 in the case of packaging a number of LED elements 54 on one sheet of the wiring substrate 51, thereby causing a problem in achieving a high-density packaging process. In addition, these bonding methods tend to cause degradation in reliability since the LED element 54 is subjected to thermal stress during the bonding process.

The third bonding method using the anisotropic conductive paste 57, on the other hand, does not cause any short circuit, which is different from the cases wherein the first and second bonding methods are adopted, and makes it possible to achieve a high-density packaging process. In this bonding method, however, it is necessary to conduct the thermocompression bonding while the LED element is kept in a uniform heating and pressure-applying state with respect to the wiring substrate 51, with the anisotropic conductive paste 57 sandwiched in between. For this reason, this method requires a special thermocompression bonding jig (not shown) having a complicated structure, and the bonding process thus requires troublesome and time-consuming jobs. Further, stress, which is caused by thermocompression bonding during the bonding process, is inevitably applied onto the LED element 54 and the wiring substrate 51. Moreover, it is necessary to increase the size of the external metal electrodes 55 in order to suppress offsets in the height of the LED element 54 during the bonding process and to maintain sufficient contact areas for the anisotropic conductive paste 57.

SUMMARY OF THE INVENTION

The objective of the present invention is to provide a bonding method for chip-type electronic parts which never causes any short circuit and is capable of miniaturizing the electronic parts as well as narrowing the mounting pitch so as to achieve a high-density packaging, and which improves the reliability by eliminating stress to be applied thereon.

In order to achieve the above-mentioned objective, the bonding method for chip-type electronic parts of the present invention, which is operative when a chip-type electronic part is electrically connected to a metal wiring pattern on a wiring substrate, is provided with: the first step in which the electronic part is prefixed onto an element-mounting section of the wiring substrate by using a non-conductive adhesive agent while an external metal electrode of the electronic part is brought close to, or in contact with the metal wiring pattern formed on the wiring substrate; and the second step in which the wiring substrate and the electronic part that has been prefixed thereon are subjected to an electroplating process while they are immersed into plating liquid containing a metal component, so that the metal component, which is deposited on the metal wiring pattern, grows to form a metal layer in such a manner that it connects the external metal electrode and the metal wiring pattern.

In accordance with the above-mentioned bonding method, the metal component, which is deposited on the metal wiring pattern on the wiring substrate through the electroplating process, grows to form the metal layer, and the metal wiring pattern and the external metal electrode of the chip-type electronic part, which have been closely placed, are thus allowed to connect and conduct with each other through the metal layer. Further, during the electroplating process, the deposition and growth of the metal component occur only at the metal portions through which an electric current is allowed to flow, and no other portions except the metal wiring pattern and the external metal electrode are subjected to the deposition of the metal component. Therefore, it becomes possible to prevent a short circuit that might occur between the external metal electrodes or between the portions of the metal wiring pattern.

This arrangement makes it possible to narrow the gap between the opposing external metal electrodes in the chip-type electronic part, and also to miniaturize the chip-type electronic part. Further, it becomes possible to narrow the packaging pitch of the chip-type electronic part; this enables a high-density packaging of the chip-type electronic parts formed on the wiring substrate of one sheet. Moreover, with this bonding method, it is possible not only to package the chip-type electronic parts on one surface of the wiring substrate with high density, but also to package the chip-type electronic parts on both sides of the wiring substrate with high density at the same time.

Furthermore, with the above-mentioned bonding method, no stress, such as caused by heat and pressure during the bonding process, is applied onto the wiring substrate and the chip-type electronic part. This makes it possible to remarkably improve the reliability of the apparatus.

Furthermore, with the above-mentioned bonding method, the metal wiring pattern and the external metal electrodes are connected to each other through the metal layer; this makes it possible to miniaturize the metal wiring pattern and the external metal electrodes, and also to make the thickness of each external metal electrode thinner than that conventionally used.

In addition, in the case when a protective plating film is formed on another metal pattern formed on the wiring substrate, the metal component may also be deposited simultaneously on this metal pattern and allowed to grow as the protective film during the above-mentioned electroplating process. In this arrangement, simultaneously as the metal layer is formed on the metal wiring pattern, a protective layer, made of the deposited metal component, is also formed on the metal pattern; this eliminates the necessity of having to form the protective plating layer by using another process. As a result, it becomes possible to reduce time-consuming jobs and also to cut the cost of production.

Moreover, the thickness of the metal layer or the protective layer, thus formed, may be controlled easily by adjusting those factors, such as the current density and the plating time, during the electroplating process.

For a fuller understanding of the nature and advantages of the invention, reference should be made to the ensuing detailed description taken in conjunction with the accompanying drawings.

DESCRIPTION OF THE EMBODIMENTS

Figure 1:
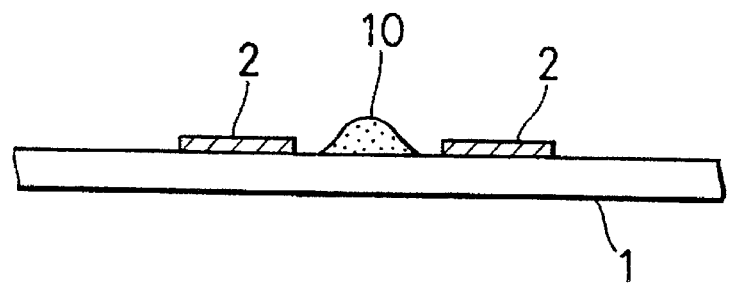
FIG. 1(a) is an explanatory drawing that shows a state where a predetermined amount of non-conductive adhesive agent is applied onto an element-mounting section in a bonding method for an LED element of one embodiment of the present invention.
FIG. 1(b) is an explanatory drawing that shows a state where the LED element is prefixed onto the element-mounting section through the non-conductive adhesive agent in the above-mentioned bonding method.
FIG. 1(c) is an explanatory drawing that shows a state where portions of a metal wiring pattern and external metal electrodes of the LED element are bonded to each other through a metal layer, after having been subjected to an electroplating process, in the above-mentioned bonding method.
FIG. 1(d) is an explanatory drawing that shows a state where, after the metal wiring pattern and the external metal electrodes of the LED element have been bonded through the metal layer, the non-conductive adhesive agent has been removed therefrom, in the above-mentioned bonding method.
Figure 1:
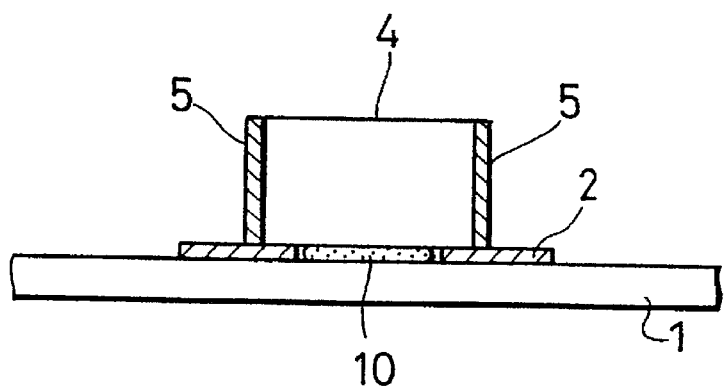
Figure 1:
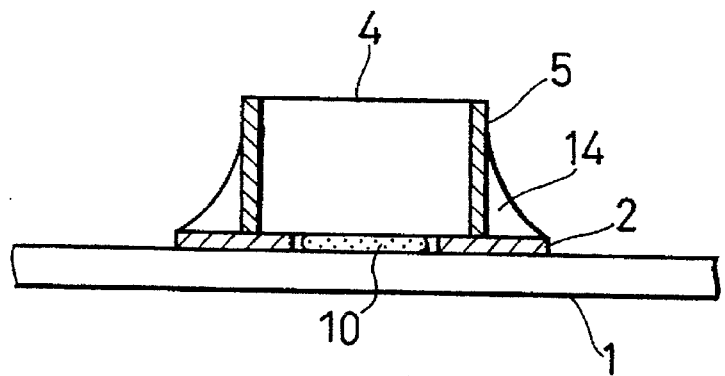
Figure 1:
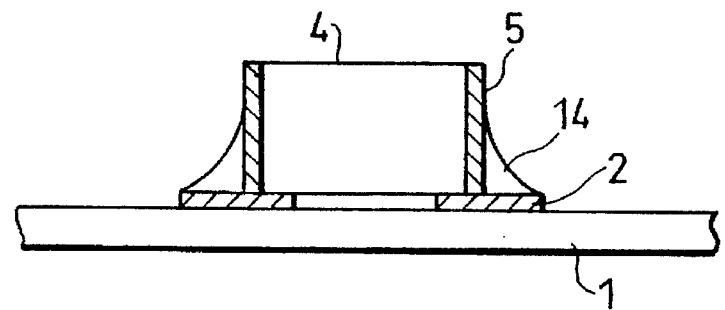
Figure 2:
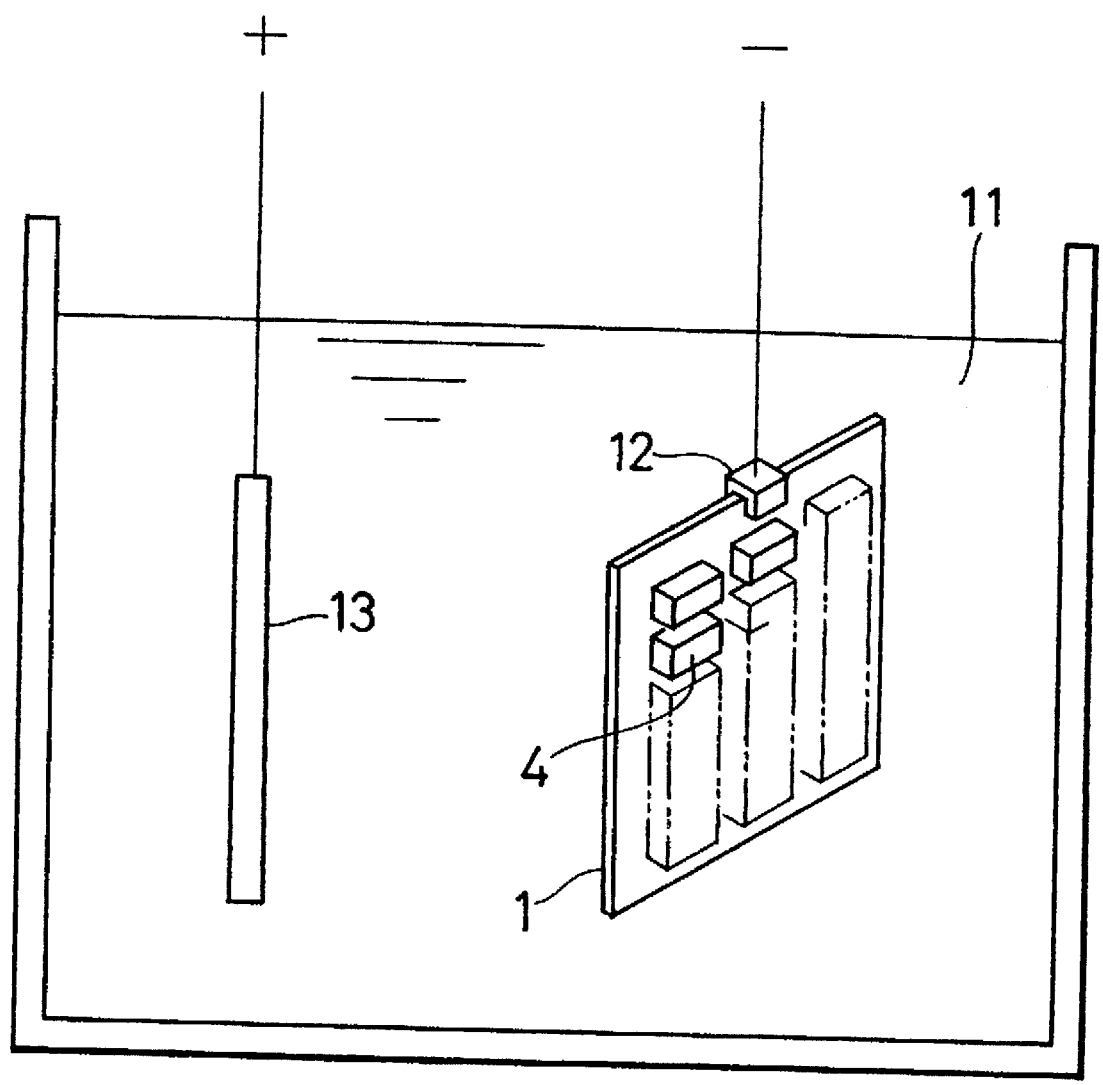
FIG. 2 is an explanatory drawing that schematically shows the electroplating process in the above-mentioned bonding method.
Figure 3:
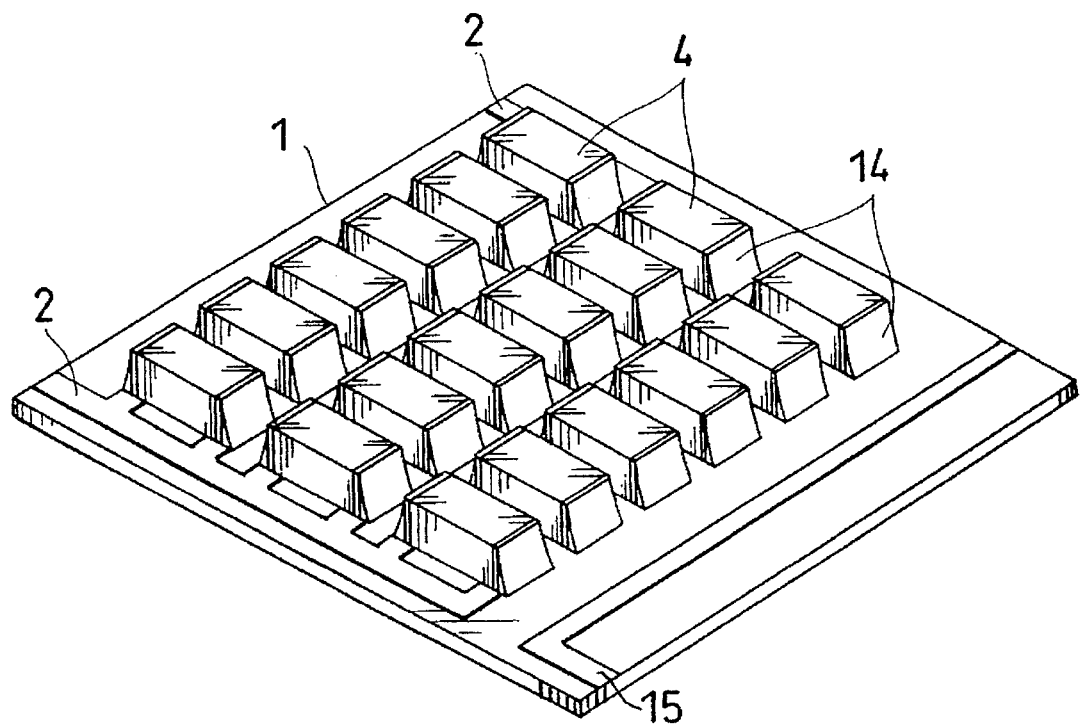
FIG. 3(a) is a perspective view of one example of an LED display apparatus wherein the above-mentioned bonding method has been adopted.
FIG. 3(b) is a side view of one example of an LED display apparatus wherein the above-mentioned bonding method has been adopted.
Figure 3:
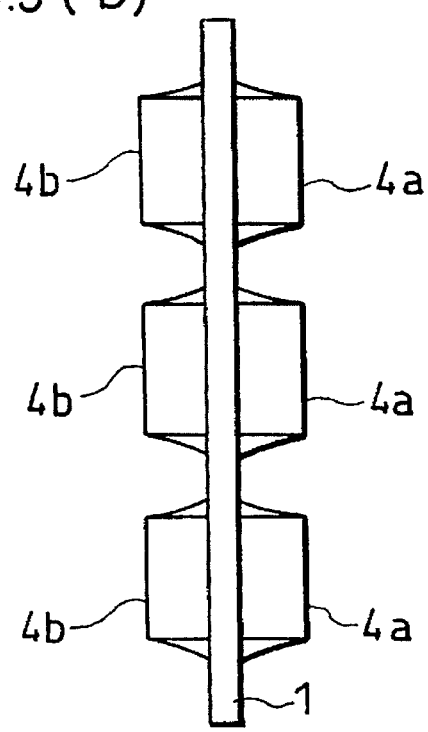
Figure 4:
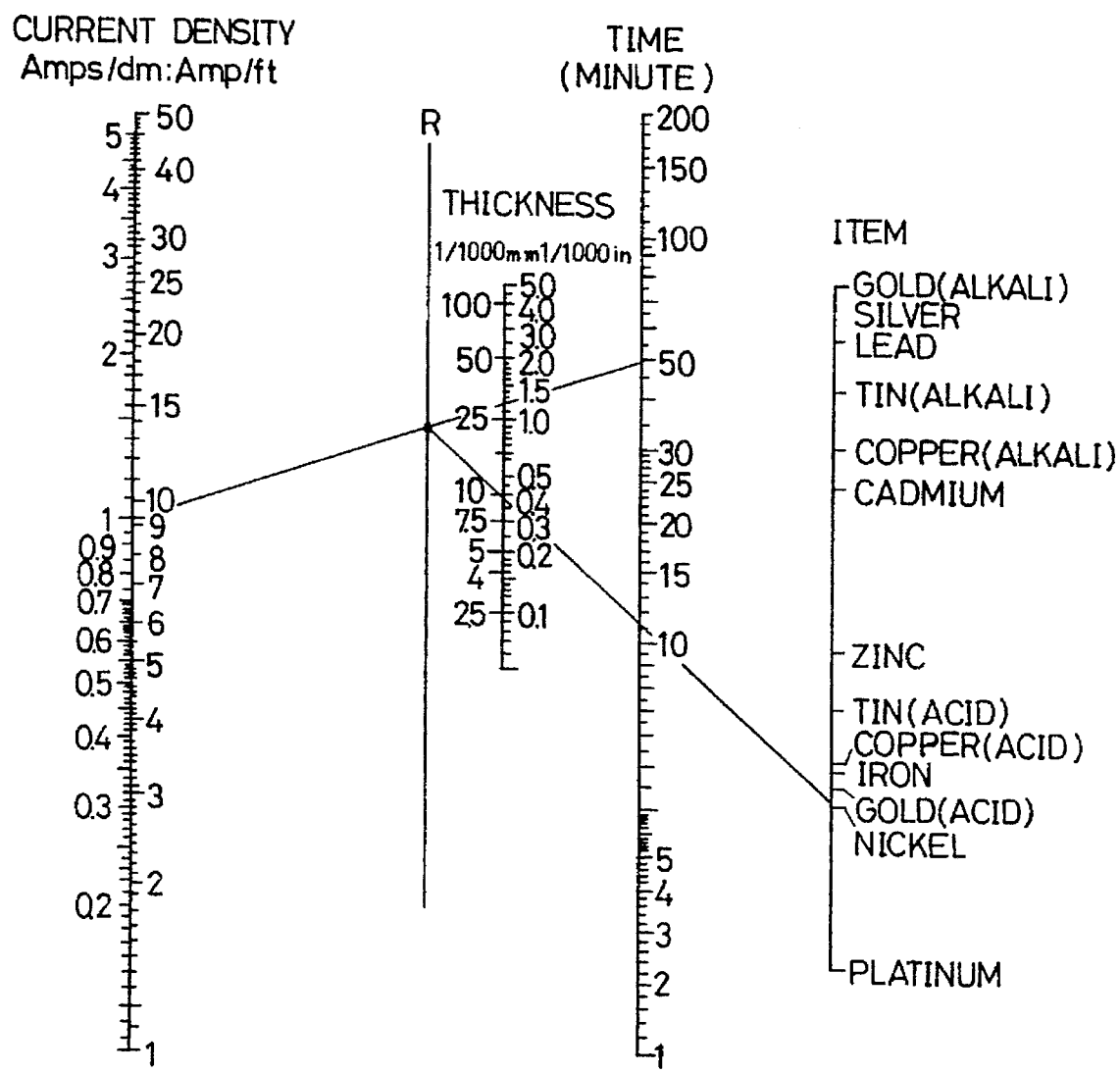
FIG. 4 is an explanatory drawing that shows relationships between the thickness of plating and the processing conditions.
Figure 5:
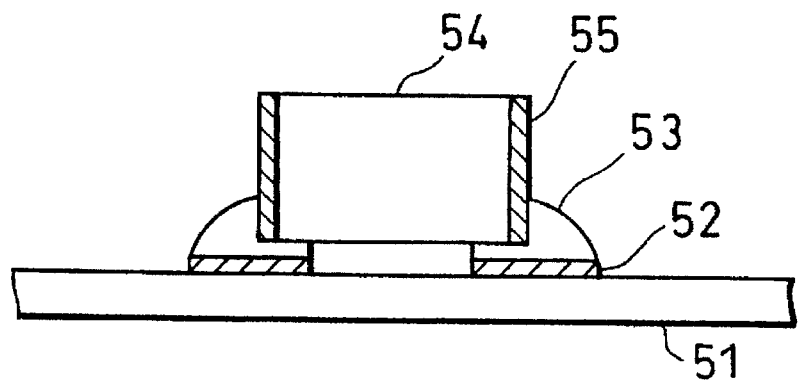
FIG. 5 is an explanatory drawing that shows a conventional bonding method for LED elements.
Figure 6:
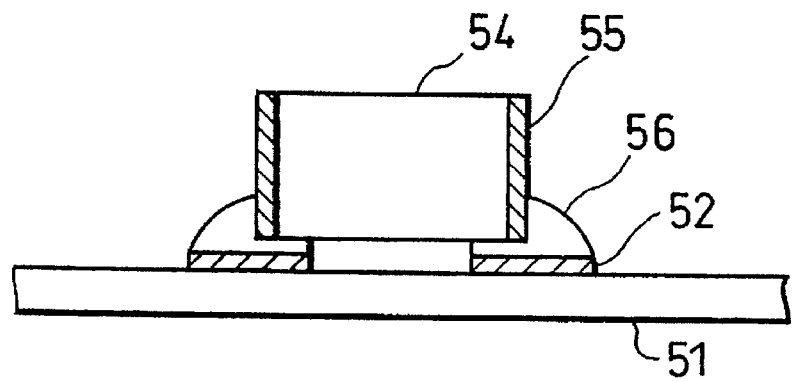
FIG. 6 is an explanatory drawing that shows another conventional bonding method for LED elements.
Figure 7:
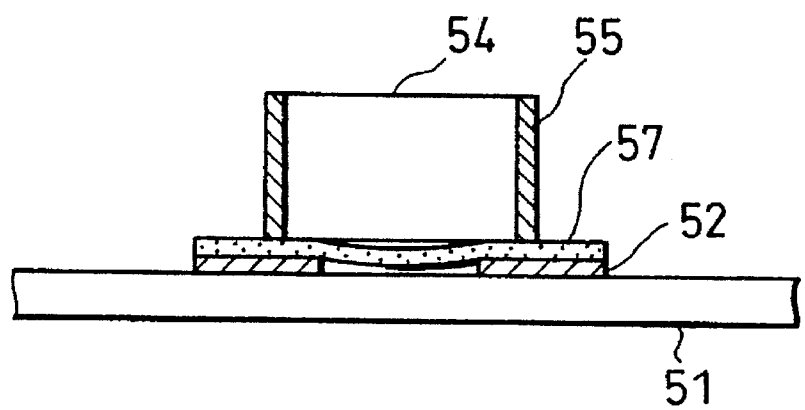
FIG. 7 is an explanatory drawing that shows still another conventional bonding method for LED elements.

Referring to FIGS. 1(a) through 1(d) as well as FIGS. 2 through 4, the following description will discuss one embodiment of the present invention.

In the present embodiment, the chip-type electronic part is exemplified by an LED element 4. First, a wiring substrate 1, which has a surface on which a predetermined metal wiring pattern 2 is formed, and an LED element 4 to be mounted on the wiring substrate 1 are provided. Next, as shown in FIG. 1(a), a predetermined amount of non-conductive adhesive agent 10, such as an epoxy resin, is applied onto an element-mounting section, that is, a region that is located between paired portions of the metal wiring pattern 2 that are formed on respective paired opposing positions on the wiring substrate 1. Then, as shown in FIG. 1(b), the LED element 4 is placed on the element-mounting section of the wiring substrate 1 with the applied non-conductive adhesive agent 10 sandwiched in between, and the LED element 4 is prefixed onto the element-mounting section by the use of the non-conductive adhesive agent 10. At this time, external metal electrodes 5, each formed on each end of the LED element 4, are brought close to, or into contact with the respective portions of the metal wiring pattern 2.

Next, as schematically illustrated in FIG. 2, the wiring substrate 1, which has the LED element 4 prefixed on its surface, is immersed into plating liquid 11 that contains a predetermined metal component, that is, plating liquid 11 that contains, for example, nickel as the metal component. Here, the metal wiring pattern 2, formed on the surface of the wiring substrate 1, is connected to the negative (−) electrode 12 of the plating device. The positive (+) electrode 13 is, on the other hand, immersed into the plating liquid 11 on the opposite side. Additionally, the metal component contained in the plating liquid 11 is not intended to be limited to nickel: the metal component is preferably selected from metals, such as solder, tin, gold, and palladium, according to the need.

Successively, an electric current is supplied between the negative electrode 12 and the positive electrode 13 that are provided in the plating device, and an electroplating process is thus carried out with respect to the wiring substrate 1. This electroplating process is carried out by using, for example, a watts bath, which is one of the nickel sulfate baths that are known as one example of nickel plating processes. Through the electroplating process, nickel, which is a metal component contained in the plating liquid 11, is deposited on the metal wiring pattern 2 of the wiring substrate 1. As the metal layer 14, made of nickel thus deposited, grows, the metal wiring pattern 2 and the external metal electrodes 5 of the LED element 4, which are brought close to, or in contact with each other, are connected through the metal layer 14, and allowed to conduct with each other, as shown in FIG. 1(c). Here, in this case, the deposition and growth of the metal component occurs only at the metal portions where the current is flowing, and no deposition of the metal component takes place at the other portions except the metal wiring pattern 2 and the external metal electrodes 5.

In this method, only the metal wiring pattern 2 and the external metal electrodes 5, which form the metal portions, are connected to each other through the metal layer 14 that has been deposited and has grown up through the electroplating process; therefore, no short circuit is caused between the external metal electrodes 5 and between the portions of the metal wiring patterns 2. Different from the conventional methods which have a restriction in narrowing the gap between the opposing external metal electrodes 5 of the LED element 4, this method makes it possible to narrow the gap without such a restriction, and also to miniaturize the respective LED elements 4. In the same manner, it is possible to narrow the packaging pitch of the LED elements 4. As a result, it becomes possible to easily design an LED display apparatus shown in FIG. 3(a), such as a light-source-use LED array, which has a number of LED elements 4 that are packaged on a wiring substrate 1 of one sheet with high packaging density. Moreover, with this method, it is possible not only to package a number of LED elements 4 on one surface of the wiring substrate 1 with high density, but also to package LED elements 4a and 4b on both sides of a wiring substrate 1 with high density at the same time, as shown in FIG. 3(b).

Furthermore, with the above-mentioned bonding method, no stress, such as caused by heat and pressure during the conventional bonding process, is applied onto the wiring substrate 1 and the LED element 4. This makes it possible to remarkably improve the reliability of the apparatus.

In addition, in the case when the electroplating process is used for connecting the metal wiring pattern 2 and the external metal electrodes 5 through the metal layer 14, it is possible to miniaturize the metal wiring pattern 2 and the external metal electrodes 5 respectively. Further, the thickness of each external metal electrode 5, which used to be in the order of, at least, 50 microns in the conventional methods, is reduced to the order of several microns by the use of the above-mentioned method.

Additionally, the non-conductive adhesive agent 10, which is used for prefixing the LED element 4 onto the wiring substrate 1 in the above-mentioned method, does not cause any inconvenience even if it is left thereon, since its adhesive strength is relatively small compared with that of the metal layer 14; however, it may be removed therefrom by using an organic solvent or other solvents, as shown in FIG. 1(d).

Moreover, in the case where a protective plating film is formed on another metal pattern 15 formed on the wiring substrate 1, the negative electrode 12 of the plating device is also connected to this metal pattern 15 upon carrying out the electroplating process. With this arrangement, the metal component in the plating liquid 11 is also deposited on the metal pattern 15. Therefore, simultaneously as the metal layer 14 is formed on the metal wiring pattern 2, the protective layer, made up of the metal component thus deposited, is also formed on the metal pattern 15; this eliminates the necessity of having to form the protective plating layer by using another process. As a result, it becomes possible to reduce time-consuming jobs and also to cut the cost of production.

Moreover, the thickness of the metal layer 14 or the protective layer that is formed as described above, may be controlled easily by adjusting those factors, such as the current density and the plating time, during the electroplating process. It has already been known to the prior art that the processing conditions for obtaining a necessary thickness of plating can be calculated based on the relationships, for example, shown in FIG. 4.

For example, let us assume that the metal to be deposited is nickel, and that the electroplating process is carried out under the conditions of a current density of 1 Amps/dm$^2$ and plating time of 50 minutes. In this case, as shown in FIG. 4, the corresponding values of the current density and the time is connected by a straight line, and a point at which this straight line intersects line R is connected to nickel point in kinds of metal by a straight line. An intersection of this straight line and the thickness line indicates a thickness of plating to be formed, and in this case the thickness of plating is 10/1000=1/100 mm. Based on these well-known relationships, the thickness of a plating film to be formed is easily controlled by adjusting the current density and the plating time.

In the above-mentioned embodiment of the present invention, the chip-type electronic part is supposed to be an LED element 4; however, the present invention is not intended to be limited to the LED element 4, and the present invention is applicable to other electronic parts, such as, for example, ceramic capacitors and ceramic resistors.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A bonding method for electrically connecting an electronic part comprising a semiconductor chip to a metal wiring pattern formed so as to be exposed to a surface of a wiring substrate comprising:

(a) prefixing the electronic part on an element-mounting section of the wiring substrate by using a non-conductive adhesive agent such that an external metal electrode of the electronic part is placed on the metal wiring pattern formed on said wiring substrate, and the external metal electrode is brought in close proximity to, or in contact with, the metal wiring pattern on the wiring substrate without having any member between the external metal electrode and the metal wiring pattern; and (b) carrying out an electroplating process on the wiring substrate and the electronic part that has been prefixed thereon while they are immersed in a plating liquid containing a metal component with the metal wiring pattern being connected to one of the electrodes of an electroplating device, so that the metal component, which is specifically deposited only on the metal wiring pattern, grows to form a metal layer in such a manner that the external metal electrode and the metal wiring pattern are connected to each other through only the metal layer, whereby the external metal electrode and the metal wiring pattern are stably connected electrically and mechanically through only the metal layer formed by an electroplating process.

2. The bonding method as defined in claim 1, wherein the electronic part is a light emitting diode element.

3. The bonding method as defined in claim 1, further comprising a step of:

depositing the metal component also on another metal wiring pattern formed on the wiring substrate simultaneously as the electroplating process of the second step is carried out, the metal component being allowed to grow as a protective layer.

4. The bonding method as defined in claim 1, wherein the metal component contained in the plating liquid is nickel.

5. The bonding method as defined in claim 4, wherein the electroplating process is carried out by the use of a plating liquid containing a metal component comprising nickel sulfate.

6. The bonding method as defined in claim 1, wherein the non-conductive adhesive agent comprises an epoxy resin.

7. The bonding method as defined in claim 1, further comprising:

removing the non-conductive adhesive agent by using a solvent for dissolving the material of the non-conductive adhesive agent after completion of step (b).

8. The bonding method as defined in claim 1, wherein step (b) further comprises:

adjusting the current density and plating time of the electroplating process in order to control the thickness of the metal layer that is to be formed by the electroplating process.

9. The bonding method as defined in claim 3, wherein step (b) further comprises:

adjusting the current density and plating time of the electroplating process in order to control the thickness of the metal layer and the protective layer that are to be formed by the electroplating process.

10. The boding method as defined in claim 1, wherein step (a) prefixes a plurality of the electronic parts on the wiring substrate and step (b) connects the electronic parts to the metal wiring pattern at the same time.

11. The bonding method as defined in claim 10, wherein the wiring substrate has metal wiring patterns formed on both sides thereof and the first step prefixes the electronic parts on both sides of the wiring substrate.

* * * * *